US011054328B2

(12) United States Patent
Srinivasan et al.

(10) Patent No.: US 11,054,328 B2
(45) Date of Patent: Jul. 6, 2021

(54) PARASITIC INSENSITIVE SAMPLING IN SENSORS

(71) Applicant: pSemi Corporation, San Diego, CA (US)

(72) Inventors: Vishnu Srinivasan, Austin, TX (US); Ion Opris, San Jose, CA (US); Keith Bargroff, San Diego, CA (US)

(73) Assignee: pSemi Corporation, San Diego, CA (US)

( * ) Notice: Subject to any disclaimer, the term of this patent is extended or adjusted under 35 U.S.C. 154(b) by 146 days.

(21) Appl. No.: 16/294,824

(22) Filed: Mar. 6, 2019

(65) Prior Publication Data

US 2020/0284679 A1 Sep. 10, 2020

(51) Int. Cl.
*G01L 9/12* (2006.01)
*H03M 3/00* (2006.01)
*B81B 7/00* (2006.01)

(52) U.S. Cl.
CPC .............. *G01L 9/12* (2013.01); *B81B 7/007* (2013.01); *B81B 7/0058* (2013.01); *H03M 3/414* (2013.01); *H03M 3/458* (2013.01); *B81B 2201/0264* (2013.01); *H03M 3/438* (2013.01)

(58) Field of Classification Search
CPC ......... G01L 9/12; H03M 3/458; H03M 3/414; H03M 3/438; H03M 3/494; B81B 7/0058; B81B 7/007; B81B 2201/0264
See application file for complete search history.

(56) References Cited

U.S. PATENT DOCUMENTS

| 4,517,622 | A | 5/1985 | Male |
| 6,509,746 | B1 * | 1/2003 | Wang .................. G01D 5/24 324/678 |
| 2002/0178827 | A1 | 12/2002 | Wang |
| 2006/0273805 | A1 | 12/2006 | Peng et al. |
| 2007/0171108 | A1 * | 7/2007 | Wang .................. G01L 9/12 341/143 |
| 2014/0260690 | A1 | 9/2014 | Corder et al. |
| 2016/0341623 | A1 | 11/2016 | Paulitsch et al. |
| 2020/0162099 | A1 * | 5/2020 | Perrott ................. H03M 3/376 |

FOREIGN PATENT DOCUMENTS

WO 2020180541 9/2020

OTHER PUBLICATIONS

Lee, Hun Gil, International Search Report and Written Opinion received from the KIPO dated Jun. 24, 2020 for appln. No. PCT/US2020/019762, 10 pgs.

* cited by examiner

*Primary Examiner* — Xin Y Zhong
(74) *Attorney, Agent, or Firm* — Jaquez Land Greenhaus & McFarland LLP; Alessandro Steinfl, Esq.

(57) ABSTRACT

Methods and devices to mitigate time varying impairments in sensors are described. The application of such methods and devices to pressure sensors facing time varying parasitic capacitances due to water droplets is detailed. Benefits of auto-zeroing technique as adopted in disclosed devices is also described.

24 Claims, 14 Drawing Sheets

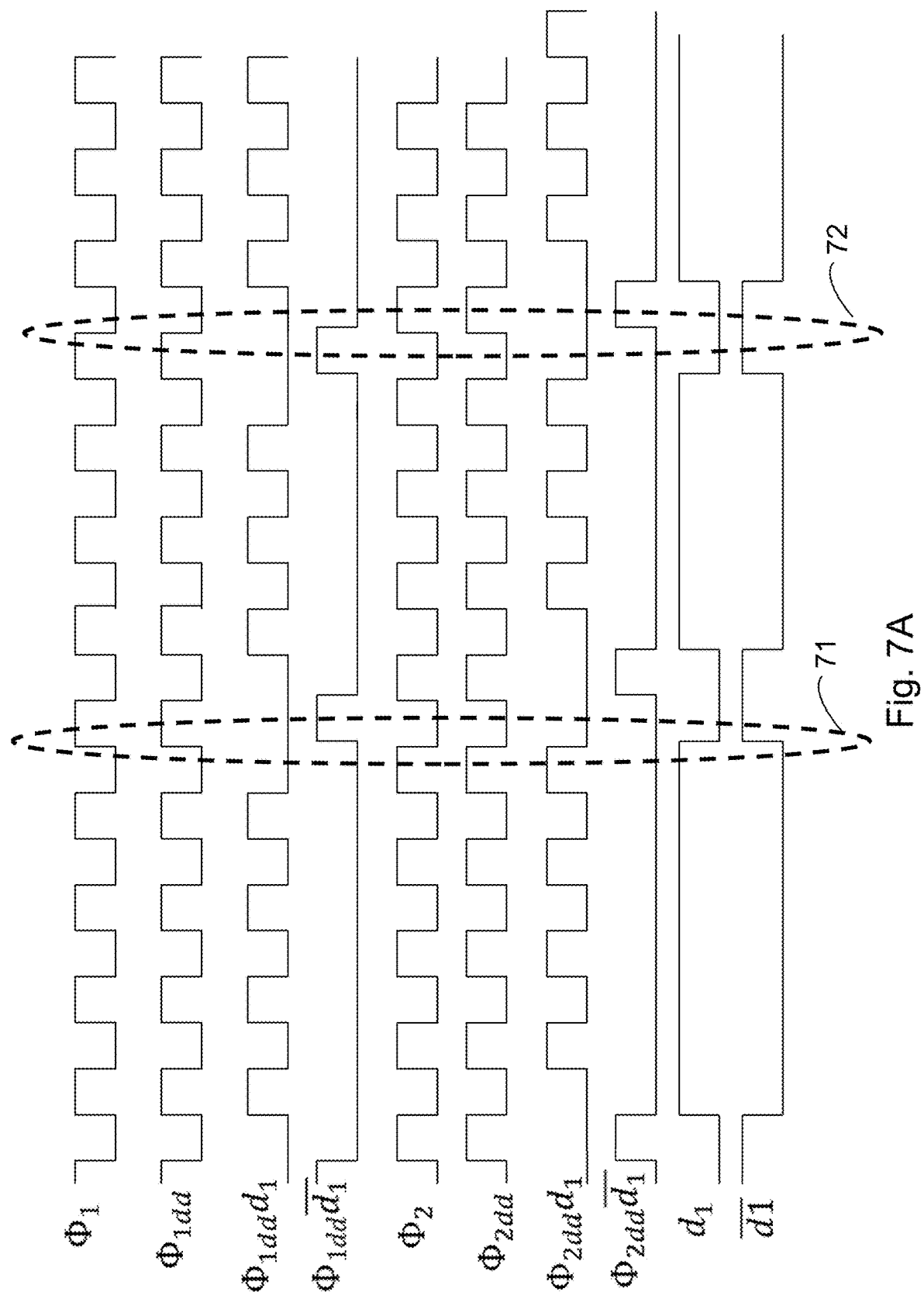

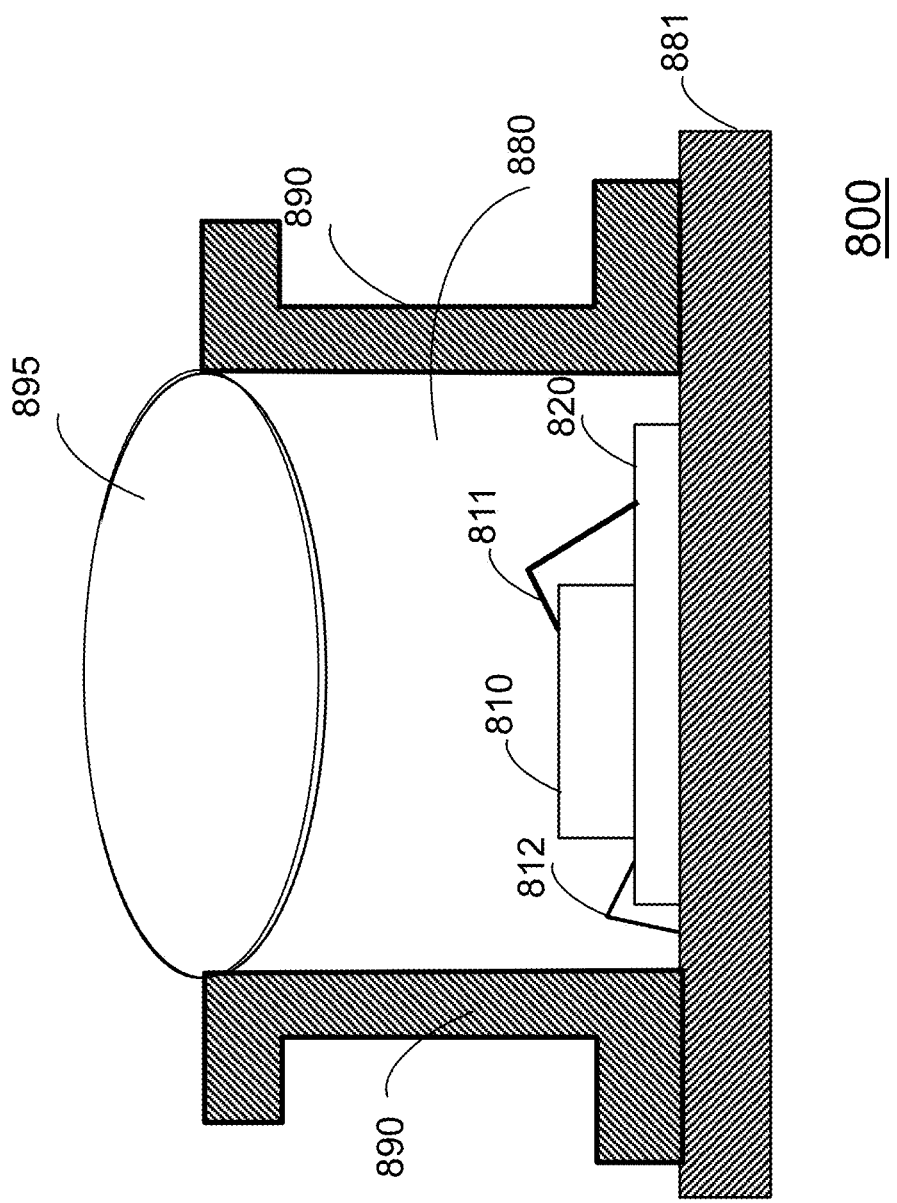

PARASITIC INSENSITIVE SAMPLING IN SENSORS

BACKGROUND

(1) Technical Field

The present disclosure is related to parasitic insensitive sensors, and more particularly to methods and apparatus for sampling sensors having time-varying parasitics.

(2) Background

Generally, performance of electronic circuits implementing sensors may be degraded due to impairments induced by the environment onto the sensors. Such impairments may be time varying, thus posing more design challenges. By way of example, capacitive pressure sensors may suffer from time varying parasitic capacitances generated by water droplets occurring on such pressure sensors when deployed. Solutions are needed to help mitigate the negative impacts of time varying impairments on performance of the circuits implementing sensors. Methods and devices described in the present disclosure address this issue and provide solutions to the problem.

Description of Concepts and Terminologies Used Throughout the Disclosure

In what follows some of the concepts later adopted by the methods and devices presented in the disclosure are defined and described.

a) Switched-Capacitor Circuits

Throughout the present disclosure, the term "switched capacitor circuit" will be used to describe an electronic circuit comprising capacitors and switches wherein charges are moved into and out of capacitors when switches are opened or closed. FIG. 1A shows an exemplary switched capacitor circuit, wherein three switches control the operation: switches S1 and S3 connect the left plate of capacitor C1 to Vin and ground, respectively, and S2 provides unity-gain feedback. In a charging phase, S1 and S2 are on and S3 is off, yielding a voltage across C1 which is equal to Vin. This is because the inverting input appears as a virtual ground. In an integration phase, S1 and S2 turn off and S3 turns on, pulling node A to ground. During this phase, and as shown in FIG. 1B, the negative feedback through C2 drives the operational amplifier (OA) input differential voltage and hence the voltage across C1 to zero The charge stored on C1 during the charging phase must then be transferred to C2, producing an output equal to $$v_{in} \frac{C_1}{C_2}.$$

In other words, Vout changes by $$v_{in} \frac{C_1}{C_2}$$

in 1 clock period (corresponding to the 2 phases described above).

b) Auto-Zeroing Technique

Throughout the present disclosure, the term "auto-zeroing" is used to describe a technique used in electronic circuits to eliminate possible offsets or noises present in such circuits. An example of offset is the input voltage offset of operational amplifiers. FIGS. 2A-2B illustrate this technique, wherein Vos represents an offset voltage at the input of the operational amplifier. In a first phase, switches S1 and S2 are closed and S3 is opened, meaning that Vout=Vos. In other words, the offset voltage is stored in capacitor Caz. In a second phase, switch S3 is closed while switches S1 and S2 are opened. In the second phase, the output is available. For an amplifier with finite direct current (DC) gain of A, the residual offset can be calculated as Vos/(A+1). For most operational amplifiers, gain A is a large number and therefore the residual offset is mostly eliminated using this technique.

c) Sigma-Delta Analog to digital Converters (ADC) and Multi-Stage Noise Shaping (MASH) Modulators Throughout the present disclosure, the term sigma-delta ADC is used to describe ADCs that operate based on sigma-delta modulation concept. FIG. 3 shows the block diagram of a typical sigma-delta ADC. As distinguished from more conventional ADC's, sigma-delta ADC's are oversampling converters operating at sampling rates larger than the Nyquist frequency of the input signal. Sigma-Delta ADCs are mainly used to realize high-resolution but also cost-effective ADCs for applications such as consumer and professional audio, communications systems, sensors, and precision measurement devices.

Throughout the present disclosure, the term "MASH modulator", wherein the acronym stands for multi-stage noise shaping is used to describe an electronic circuit which is designed by cascading lower order Sigma-delta modulators. MASH modulators have the benefit of overcoming some instability issues inherent to higher order sigma-delta modulators. Examples of typical MASH modulators known in the art are 2-1, 2-2, 2-1-1 or higher order MASH modulators. For example, this would also apply to other topologies of delta-sigma modulators such as CIFF (Chain of Integrators with weighted Feed Forward coefficients) with higher order ($3^{rd}$ and $4^{th}$ for example) modulators.

SUMMARY

According to a first aspect of the present disclosure, a sensor system is provided, comprising: a sensor comprising a sense capacitor with a variable sense capacitance; and a readout integrated circuit comprising an analog to digital converter (ADC) having an ADC input connected to the sense capacitor, wherein: a variable parasitic capacitance is able to be coupled to the ADC input; and when an input pressure is sensed by the sensor, the variable sense capacitance is modulated, thereby generating one or more ADC output signals in correspondence of the input pressure.

According to a second aspect of the present disclosure, a method of measuring pressure is described, comprising: providing a sense capacitor with a variable sense capacitance; providing a readout circuit having an integrating capacitor, wherein a variable parasitic capacitance is able to be generated across a readout circuit input; in a charging phase, sampling a first reference voltage to store first charges across the sense capacitor; and in an integration phase, transferring the first charges to the integrating capacitor, thereby generating a readout circuit output signal in correspondence of an input pressure.

Further aspects of the present disclosure can be found in the specification, claims and drawings of the present application.

DESCRIPTION OF THE DRAWINGS

FIGS. 7A-7C shows timing diagrams according to further embodiments of the present disclosure.

FIG. 8B shows the pressure sensor of FIG. 8A with a water droplet sitting on top.

DETAILED DESCRIPTION

Figure 4:
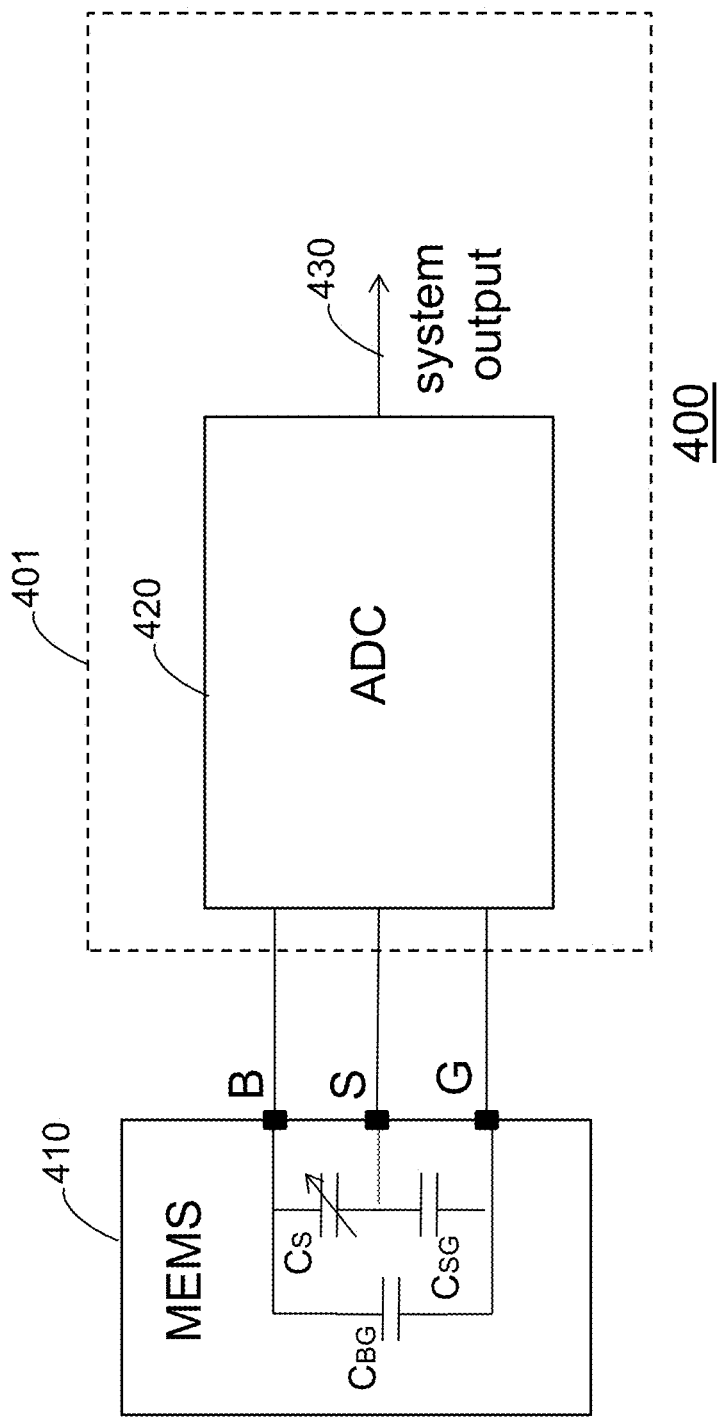
FIG. 4 shows a sensor system according to an embodiment of the present disclosure.

FIG. 4 shows a sensor system (400) in accordance with an embodiment of the present disclosure. The sensor system (400) comprises a Micro-Electro-Mechanical Systems (MEMS) sensor (410) connected to a readout integrated circuit (401) comprising an ADC (420). MEMS sensor (410) comprises a sense, a base and a guard terminal represented by letters S, B and G respectively. The time-varying capacitance of the MEMS sensor (410) is represented by a variable capacitor (Cs) connected across terminal (S, B), a parasitic capacitor ($C_{BG}$) across terminals (B, G) and parasitic capacitor ($C_{SG}$) across terminals (S, G). According to embodiments of the present disclosure, the MEMS sensor (410) is a capacitive pressure sensor wherein pressure modulates the variable capacitor ($C_S$). As will be described later in detail, capacitance variation of capacitor ($C_S$) is then measured by the ADC (420) and a corresponding system output (430) is generated accordingly.

Figure 5A:
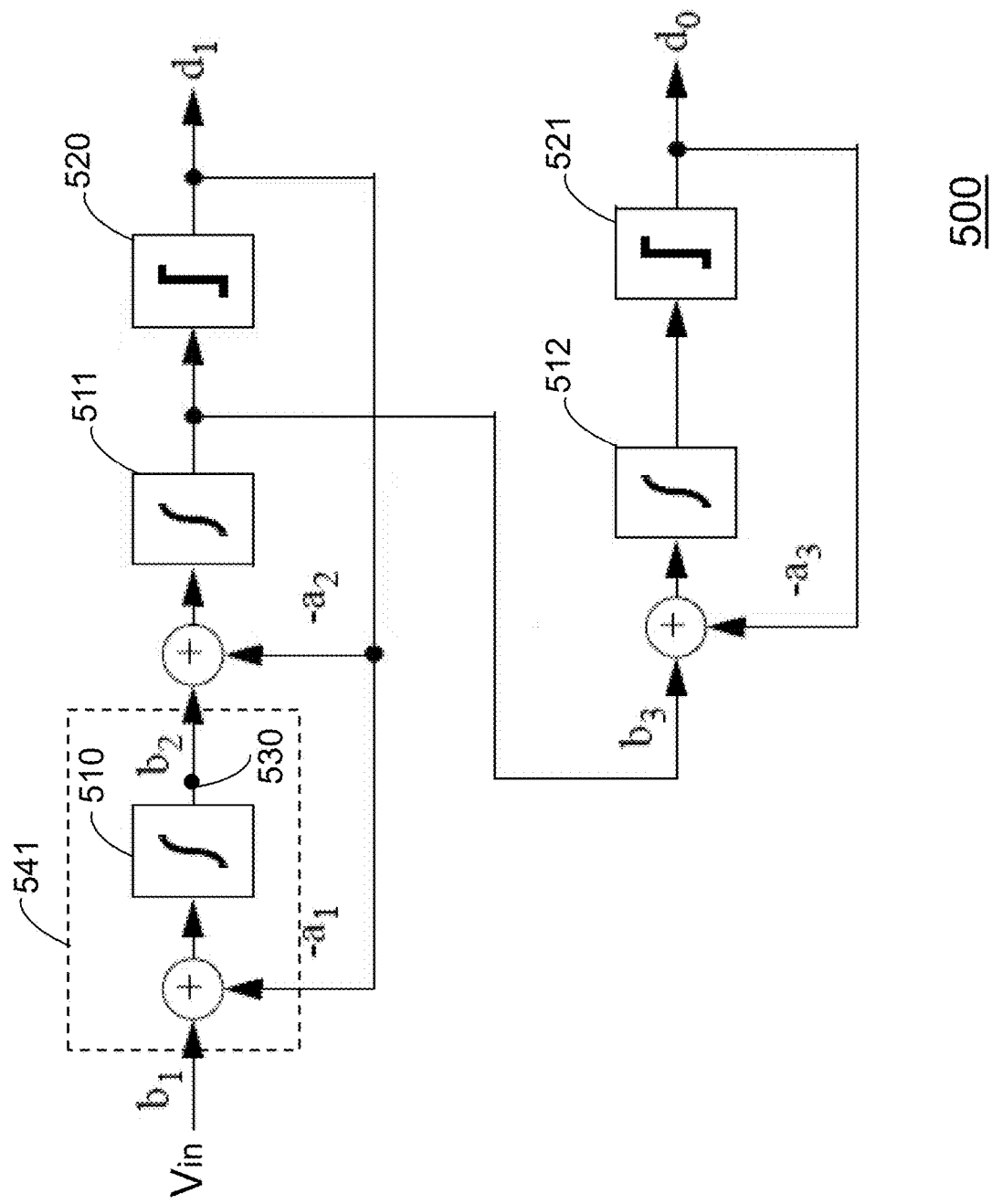
FIG. 5A shows a MASH modulator.
Figure 5B:
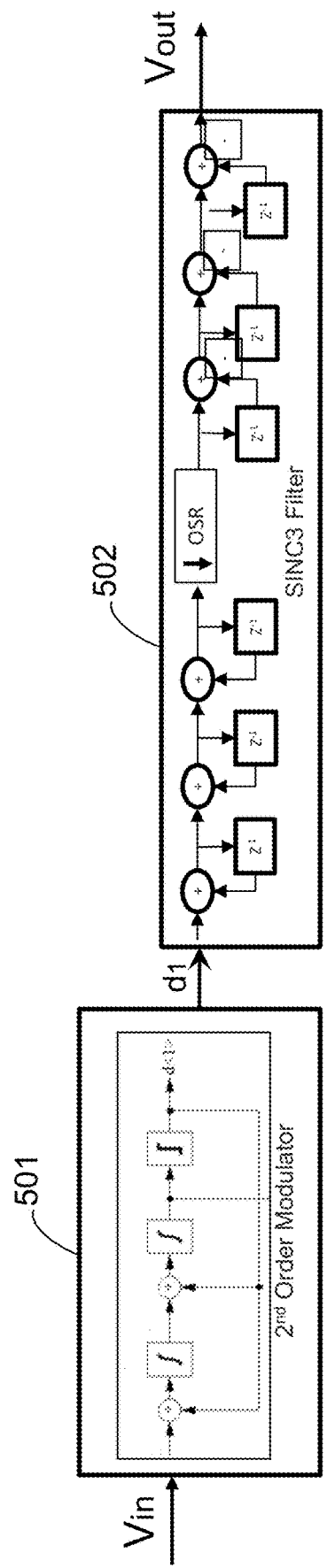
FIG. 5B shows a second order sigma-delta modulator connected to a decimation filter.

With reference to FIGS. 4-5, and in accordance with embodiments of the present disclosure, the ADC (420) comprises a MASH modulator (500) as shown in FIG. 5. According to embodiments of the present disclosure, the MASH modulator (500) may be a 2-1 MASH modulator comprising integrators (510, 511, 512) and comparators (520, 521). As also shown in FIG. 5, letters (−a1, −a2, −a3, b1, b2, and b3) represent gains of their corresponding paths. The integrator (510) comprises an integrator output node (530). According to embodiments of the present disclosure, MASH modulator (500) of FIG. 5, and therefore the ADC (420) of FIG. 4, are configured to receive an input voltage ($V_{in}$) and to generate two ADC outputs ($d_1$, $d_0$). According to further embodiments of the present disclosure, the two comparator's outputs ($d_1$, $d_0$) may be constituents of the system output (430) of FIG. 4. To complete the system, the output of the MASH modulator is typically followed by a decimation filter. In most implementations, the 1-bit data stream ($d_1$, $d_0$) will be further processed by a decimation filter, typically implemented in the digital section of the system. The output of the decimation filter may be considered to be the final output of the ADC (430). In other embodiments, $d_0$, may be ignored and only the output $d_1$ is processed by the decimation filter in the digital section. In such a situation, and as shown in FIG. 5B, the modulator is reconfigured to be a $2^{nd}$ order sigma-delta modulator (501), instead of a 2-1 MASH modulator. As is also shown in FIG. 5B, the output of the $2^{nd}$ order sigma-delta modulator (501), d1, serves as an input to the decimation filter (502). After processing the input (d1), the decimation filter (502) generates an output (Vout). According to embodiments of the present disclosure, the decimation filter output (Vout) may be a 24 bit output. As a result, the output data rate is slower as a result of the decimation process. In accordance with further embodiments of the present disclosure the 24 bit output of the decimation filter (502) may be at a rate of 32, 64, or 128 Hz.

Figure 6:
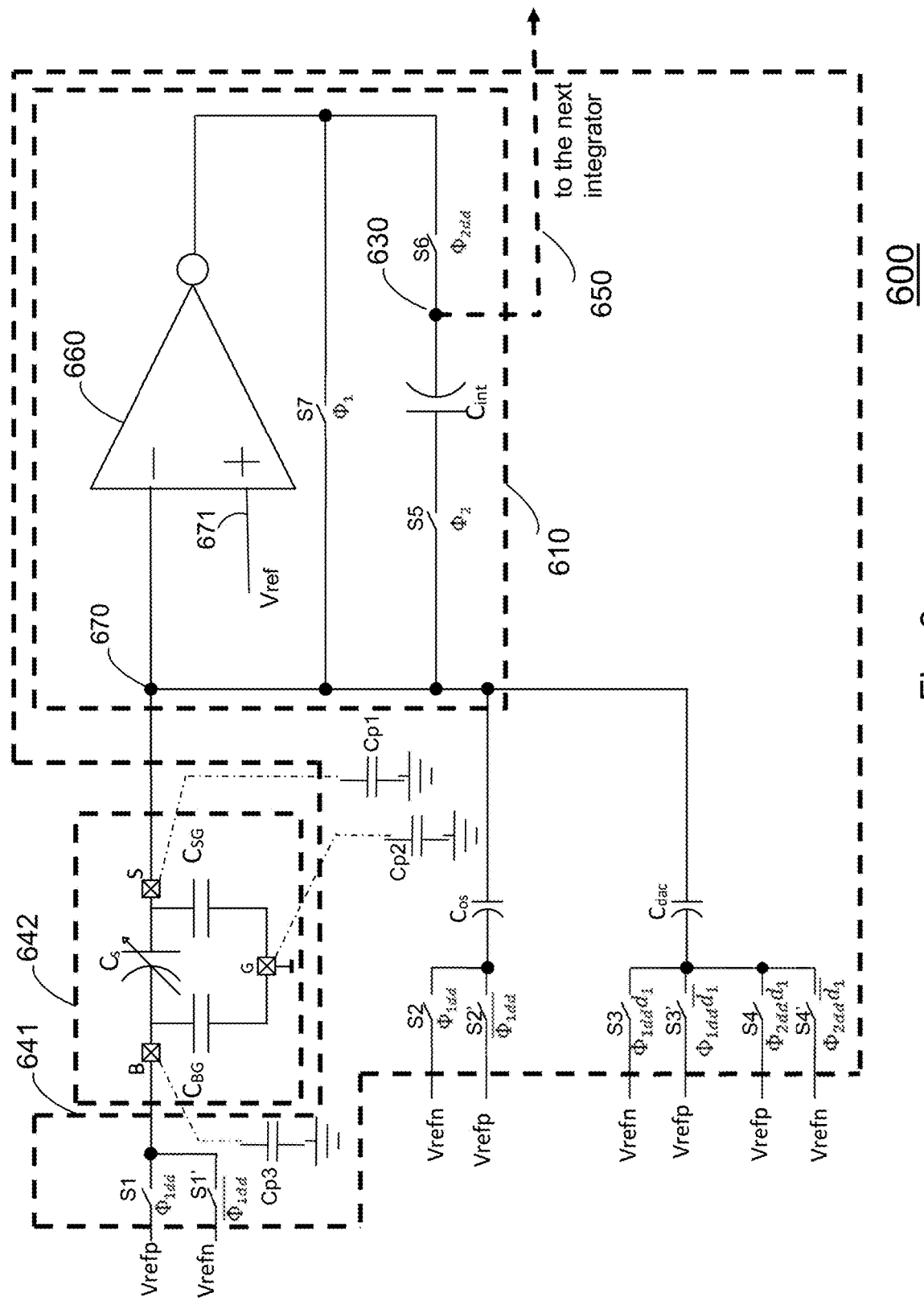
FIG. 6 shows an electronic circuit in accordance with an embodiment of the present disclosure.

FIG. 6 shows an electronic circuit (600) comprising a sigma delta modulator's analog front-end (641) connected to a MEMs sensor (642). The analog front-end (641) comprises an integrator (610). According to embodiments of the present disclosure, the integrator (610) is an exemplary implementation of the integrator (510) of FIG. 5. The capacitive block (642) comprises capacitors ($C_S$, $C_{BG}$, $C_{SG}$), connected to the sense, base and guard terminals (S, B, G) that are similar to their respective counterparts as shown in FIG. 4. In other words, capacitors ($C_S$, $C_{BG}$, $C_{SG}$) and terminals (S, B, G) may be constituents of the MEMS sensor (410) In this example a MEMs sensor with a specific configuration (B, S, G) is used. However, other sensors can be used. For example, it may be MEMs or other type, it may be pressure or temperature or acceleration, and it may be configured differently. The analog front-end (641) further comprises an offset capacitor ($C_{cos}$), a feedback capacitor ($C_{dac}$) and a plurality of switches (S1, S1' . . . S4, S4', S5, S6, S7). According to embodiments of the present disclosure, switches (S1, S1' . . . S4, S4', S5, S6, S7) may comprise of metal-oxide semiconductor field-effect transistor (MOS-FET) switches. States of such switches are controlled by clocks having various phases, each comprising a pulse stream of logical ones and zeros. Such clocks are used to manage the timing when certain capacitors sample input voltages and how they transfer stored charges to an integrating capacitor, as will be described in detail later. With reference to FIG. 6, the following convention is adopted to show each switch and the corresponding controlling clock: for each switch, the name of the clock controlling the same is provided underneath such switch. For example, a switch showing the term "$\Phi_1$" underneath, is controlled by clock ($\Phi_1$) such that when clock ($\Phi_1$) is at logic one, the switch is closed and when clock ($\Phi_1$) is at logic zero, such switch is opened.

With further reference to FIG. 6, various clocks are represented by the Greek letter ($\Phi$), each having an index. The term "dd" used in said index represents delay. As an example, switch (S1) is controlled by clock ($\Phi_{1dd}$) which is a delayed version of clock ($\Phi_1$). Moreover, the horizontal bar used in the naming of the clocks represents inversion. By way of example, clock ($\overline{\Phi_{1dd}}$) is an inverted version of clock ($\Phi_{1dd}$). In other words, when clock ($\Phi_{1dd}$) is at logic one, clock ($\overline{\Phi_{1dd}}$) is at logic zero and vice versa. Each of switches (S3, S3', S4, S4') is controlled by a clock which is generated by multiplying two pulse streams. As an example, as shown in FIG. 6, switch (S3) is controlled by clock ($\Phi_{1dd}d_1$) wherein the term "$\Phi_{1dd}d_1$" is the product of the pulse stream representing clock ($\Phi_1$dd) and the pulse stream representing output Comparator ($d_1$) of FIG. 5. With continued reference to FIG. 6, the integrator (610) comprises switches (S5 and S6), integrating capacitor ($C_{int}$) and an operational amplifier (OA) (660) having a first input node (670) and a second input node (671). According to embodiments of the present disclosure, the second input node (671) may be connected to a reference voltage ($V_{refp}$). In accordance with further embodiments of the present disclosure reference voltage ($V_{refn}$) may be ground as shown in FIG. 6. In accordance with further embodiments of the present disclosure the reference voltage ($V_{refn}$) as shown in FIG. 6 may be ground.

With reference to FIGS. 4-6, the analog front-end (641) is an exemplary implementation of the electronic block (541) of FIG. 5, and they both represent essentially the analog front-end of the ADC (420) of FIG. 4; such analog front-end receives the analog signal generated by sense capacitor ($C_s$) of FIGS. 4 and 6, as a result of sensing the pressure to be measured. Moreover, connection point (630) of FIG. 6 is the counterpart of integrator output node (530) of FIG. 5, both showing the interconnection between the integrator (610) of FIG. 6 (or the integrator (510) of FIG. 5) with the rest of modulator (500) of FIG. 5.

The electronic circuit (600) of FIG. 6 is essentially a switched capacitor circuit where the input voltage is sampled during a charging phase and the sampled data is integrated during an integration phase following the charging phase. The electronic circuit (600) is configured to receive reference voltages ($V_{refp}$, $V_{refn}$) according to embodiments of the present disclosure. According to further embodiments of the present disclosure, reference voltages ($V_{refp}$, $V_{refn}$) are positive and negative voltages respectively. Embodiments in accordance with the present disclosure may also be envisaged wherein reference voltage ($V_{refn}$) is ground.

The electronic circuit (600) of FIG. 6, more specifically, can be considered to be a ratiometric sampling of the sense capacitor ($C_s$) with respect to the reference capacitance ($C_{dac}$), wherein the same reference voltages ($V_{refp}$ and $V_{refn}$) are used to provide the charge in the sampling-phase. The amount of charge captured is dependent on the value of the sense capacitor ($C_s$), which is in turn, dependent on the pressure. By implementing the analog front-end of the sigma-delta modulator as a ratiometric comparison of capacitors, the performance of the ADC is made more robust relative to imperfections of the reference voltages $V_{refp}$ and $V_{refn}$, to a $1^{st}$ order. The offset capacitance ($C_{OS}$) is typically configured to charge or discharge out of phase with respect to the sense capacitor ($C_s$). In accordance with an embodiment of the present disclosure, the offset capacitance ($C_{OS}$) is used to center (or align) the variations of the sense capacitance ($C_S$) to the center of the full-scale of the ADC, which is set by the feedback capacitance ($C_{dac}$). In a typical embodiment, the usable ADC full scale may be half of the true full-scale as implied by the feedback (or reference) capacitance ($C_{dac}$).

FIG. 7 shows timing diagrams of various clocks controlling the state of the switches of the electronic circuit (600). Without loss of generality, for description purpose, and in what follows, it is assumed that reference ($V_{refn}$) is ground. During the sampling or charging phase, clock ($\Phi_{1dd}$) is at one and therefore, switch (S1) is closed and sense capacitor ($C_S$) is connected at one side to ($V_{refp}$) and to the OpAmp's reference node (670), at the other side. As a result, capacitor ($C_S$) is charged to $Q_S = C_S \times (V_{refp} - V_{refn})$. In this phase, the input-referred OpAmp noise (flicker noise) and offsets are also captured. This is enabled by closing S7 in phase $\Phi_1$. In the same sampling clock ($\Phi_{1dd}$) phase, the charge on the $C_{OS}$ is captured in a similar manner, but with the opposite polarity, as it is connected to Vrefn and Vref. This enables the full-scale offset to be implemented correctly at the conclusion of the phase 2

In the integration phase, clock ($\Phi_{1dd}$) is at zero and therefore, switch (S1) is opened and switch (S2) is closed. This forces the charge stored in sense capacitor ($C_s$) to move towards the first input node (670) of the OA (660) and to be transferred to the integration capacitor ($C_{int}$). To enable this charge transfer to be completed, switches S5 and S6 are closed in this clock phase. As can be seen in FIG. 7, capacitor ($C_{os}$) switches between $V_{refn}$ (ground for example) and reference voltage ($V_{refp}$) in an opposite sequence compared to sense capacitor ($C_s$). In other words, and during the charging phase, switch (S2) is closed and therefore the offset capacitor bottom plate is charged to ground. During the integration phase, switches (S1, S2) are open and based on charge conservation, an equivalent charge of $(C_s - C_{os}) \cdot (V_{refp} - V_{refn})$ is therefore transferred to integrating capacitor ($C_{int}$).

With regards to feedback capacitor ($C_{dac}$), the storage and transfer of charge is performed similarly to what described with regards to sense capacitor ($C_s$) or offset capacitor ($C_{os}$). However, the clock controlling switches (S3, S3', S4, S4') associated with feedback capacitor ($C_{dac}$) is different and is dependent on the comparator output (d1).

Figure 7B:
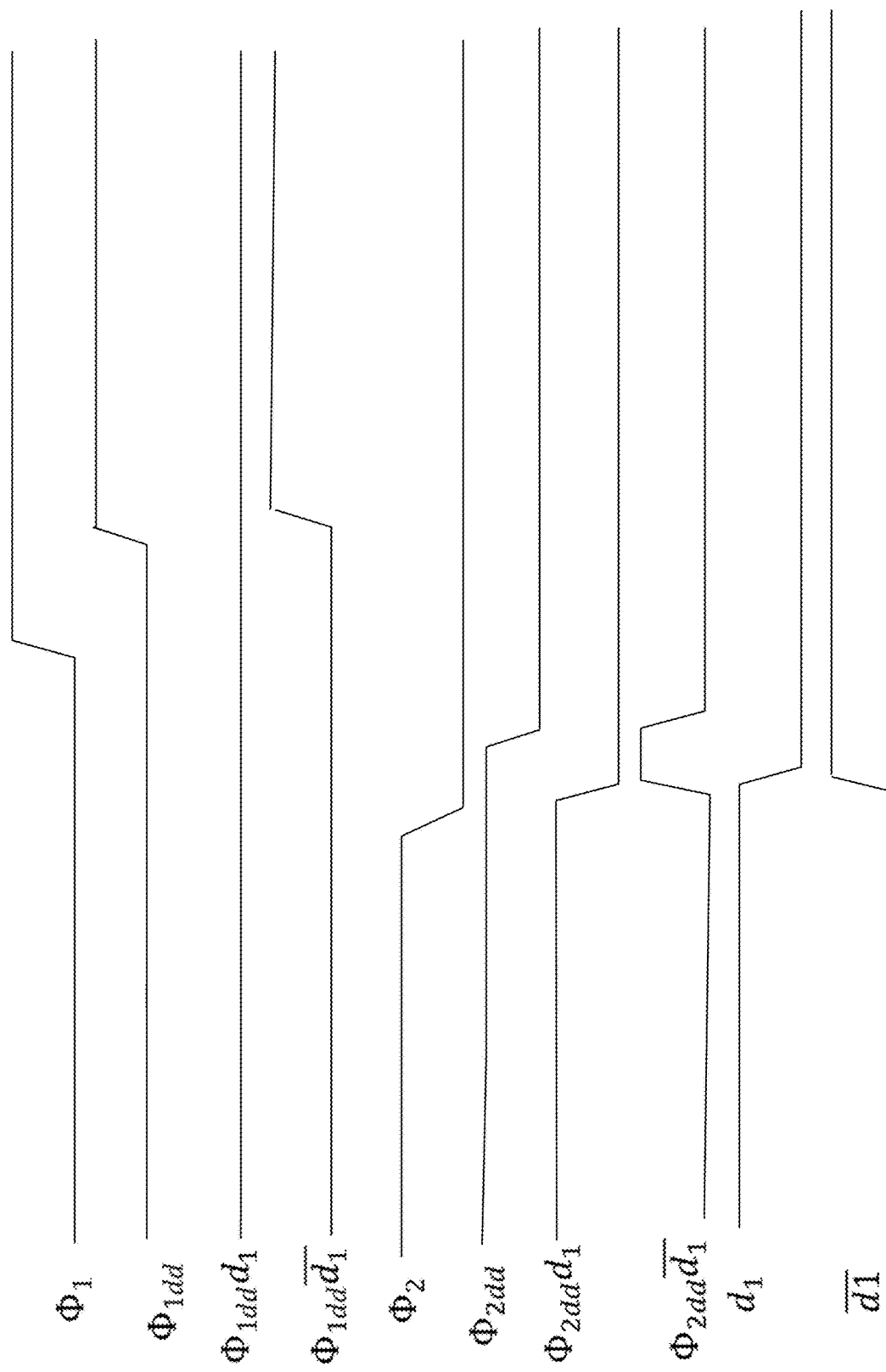
Figure 7C:
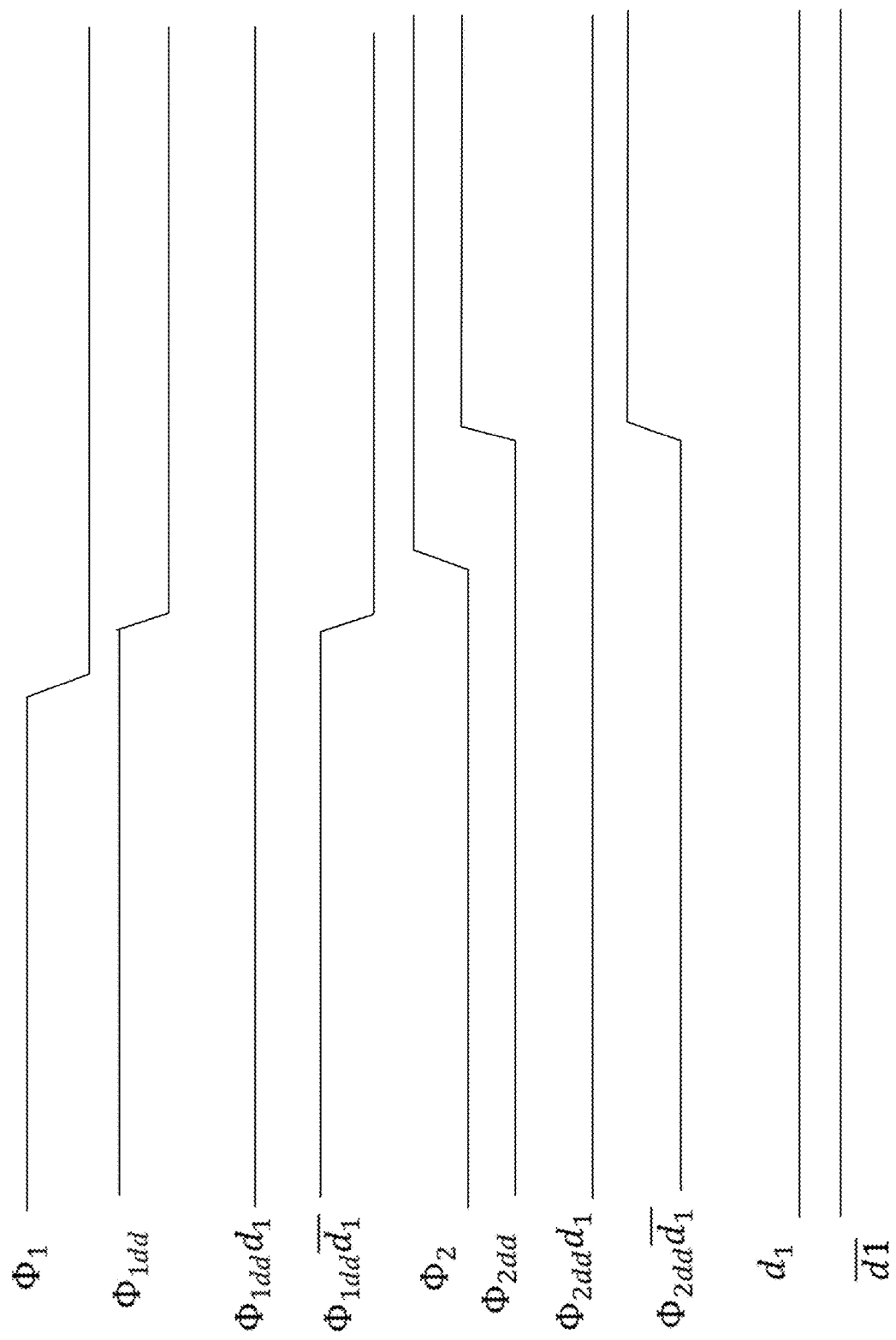

FIGS. 7A-7C shows timing diagram associated with electronic circuit (600) of FIG. 6. FIG. 7A shows a high-level timing diagram. FIGS. 7B-7C show more detailed timing diagrams when zooming-in, respectively, on regions (71, 72) of the timing diagram of FIG. 6. With reference to FIGS. 6 and 7A, during both the charging and integrating phases, the feedback capacitor ($C_{dac}$) may be connected to either the first reference voltage ($V_{refp}$) or the second reference voltage ($V_{refn}$) depending the states of the clocks ($\Phi_1$, $\Phi_2$) and output DAC ($d_1$). The data ($d_1$) dependent charge that is integrated provides the quantized negative feedback which ensures that the output bit stream of the comparator accurately reflects the average value of the sense capacitance ($C_S$).

In accordance with an embodiment of the present disclosure, the capacitance values of offset capacitor ($C_{os}$) may be chosen to be approximately half of the sense capacitor ($C_s$) variation range thus centering such variation.

Figure 1A:
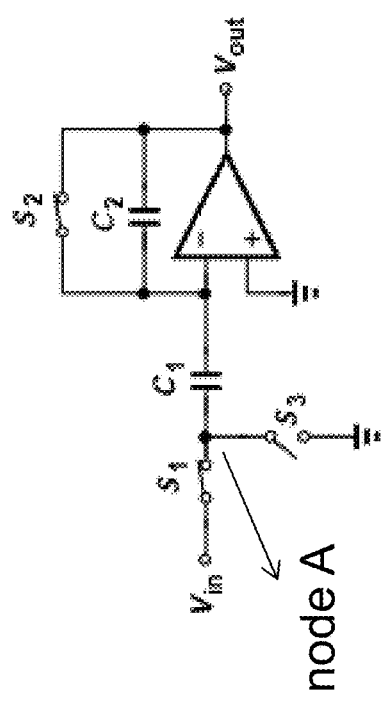
FIGS. 1A-1B show a prior art switched capacitor circuit.
Figure 1B:
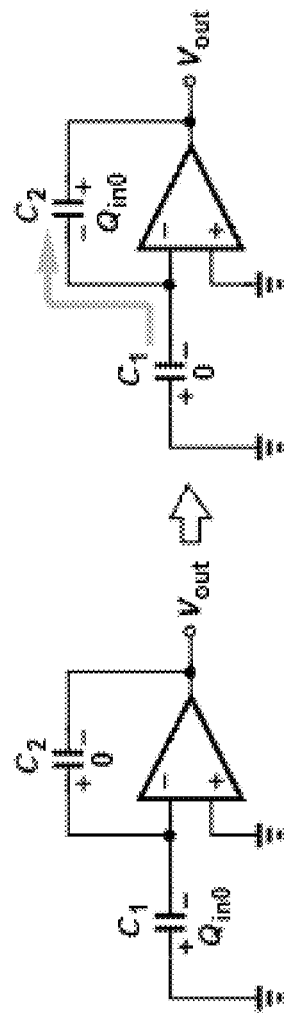
Figure 2B:
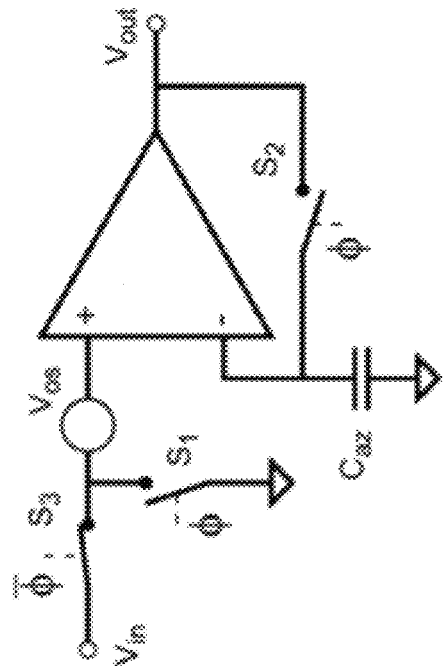
FIGS. 2A-2B show prior art electronic circuits illustrating the auto-zeroing technique.
Figure 2A:
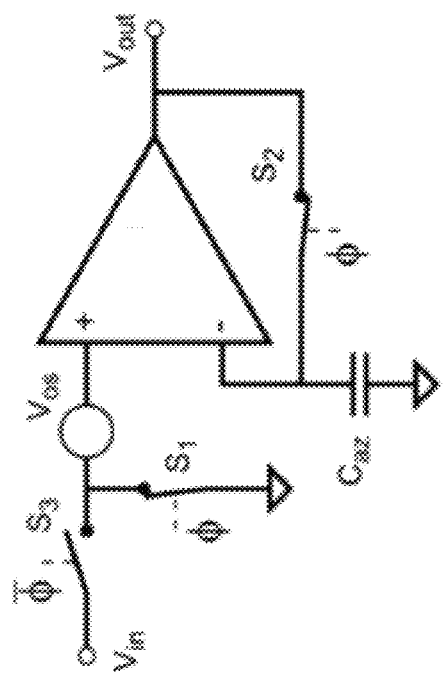
Figure 3:
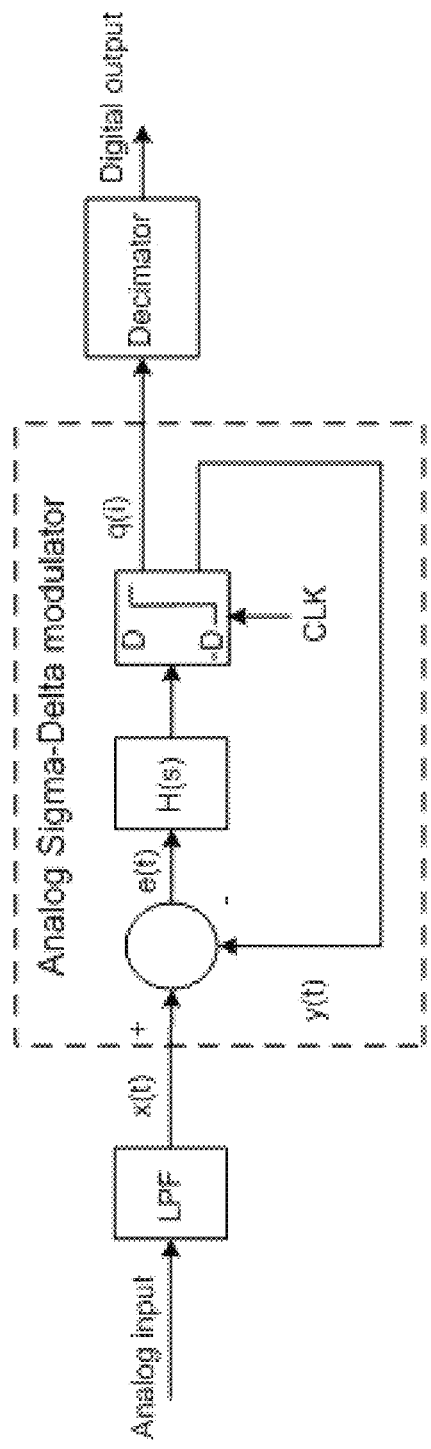
FIG. 3 shows a prior art sigma-delta analog to digital converter (ADC).

With further reference to FIGS. 7A-7B, and similar to what was previously described with respect to FIGS. 2A-2B, auto-zeroing technique is adopted to minimize negative impacts of impairments such as OA offset or flicker noise as well as any other low frequency impairments that would exist at the input side of the OA (660). This is performed by proper control of switch (S7) according to timing diagrams shown in FIGS. 7A-7C. Switch (S7) is closed before the charging phase starts, and therefore, the low frequency noise, existing at the input of the OA (660) is sampled. This is followed by the start of the charging phase, and then the integrating phase. Referring back to FIG. 6, during the integration phase, substantially equal voltages are maintained at the first and second input nodes (670, 671) of the OA (660), thus compensating for the negative impacts of low frequency parasitic at the first input (670) of the OA (660). Similarly to what was described with regards to FIGS. 2A-2B, the sampled noise is effectively divided by the open loop gain of the OA and thus reduced to a negligible amount. This mechanism will also approximately cancel out any slowly varying parasitic capacitance such as $C_{P1}$ connected to node 670. Such a parasitic capacitance may also occur due to various impediments in the environment surrounding the sensitive MEMS structure. The described auto-zeroing technique is essentially a high pass filtering mechanism with a filter transfer function such as $(1-z^{-1})$, which filters the various impairments such as slowly varying capacitance ($C_{P1}$) or the DC offset and low-frequency noise of the OpAmp (660). According to an embodiment of the present disclosure, chopping techniques in differential topologies/ circuits, instead of auto-zeroing may be used to reduce the impact of the impairments as described above.

As mentioned previously, impairments associated with pressure sensors may be time-varying. An example of sources of such impairments is water droplets occasionally sitting on pressure sensors during measurements. In what follows, more details about water droplet-induced impairments and methods and devices to mitigate negative impacts of such impairments are described.

Figure 8A:
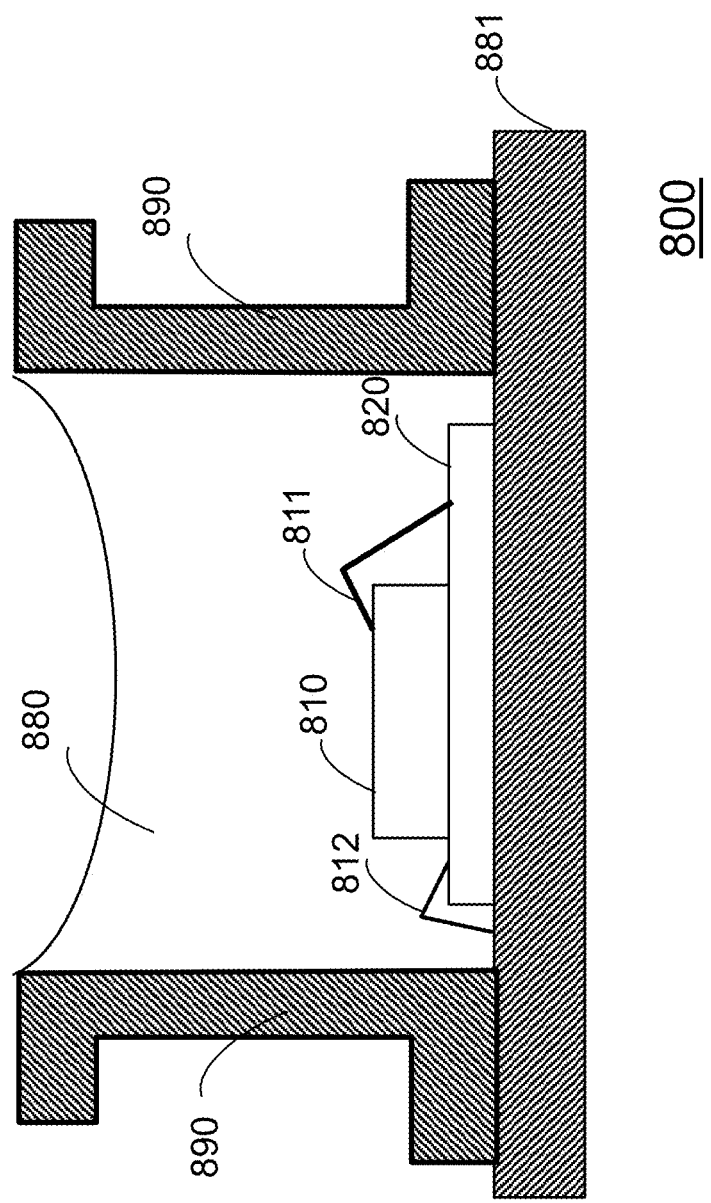
FIG. 8A shows a cross section of a pressure sensor in accordance with teachings of the present disclosure.

FIG. 8A shows a cross section of a pressure sensor (800) comprising a body (890), a MEMS sensor (810) and waterproof gel (880). The waterproof gel (880) is such that it faithfully conveys the air-pressure from outside the body (890) to the MEMS (810) sensor while protecting the MEMS sensor and the ASIC (820) from being damaged by water or other external liquids that the pressure sensor may be exposed to. The MEMS sensor (810) is connected with an integrated circuit (820) through first bondwires (811). As also shown in FIG. 8, the integrated circuit (820) is also connected with a substrate (881) via bondwires (812). The pressure to be measured is transformed through the waterproof gel (880) to the integrated circuit (820). According to embodiments of the present disclosure, the bondwires (811, 812) may be exposed to the waterproof gel (880). In accordance with further embodiments of the present disclosure, the integrated circuit (820) may comprise the ADC (420) of FIG. 4. Embodiments according to the present disclosure may also be envisaged wherein the pressure sensor (800) has no waterproof gel, but uses other methods of providing waterproofing to the ASIC.

With further reference to the water droplet scenario, FIG. 8B shows the pressure sensor (800) of FIG. 8A wherein a water (or liquid) droplet (895) is present on top of the transparent gel (880). The surface tension of the water (or liquid) may cause it to spread as shown. However it is also possible that the drop is only partially present on the surface of the gel. The water (or liquid) droplet (895) has a notably different dielectric than air. This affects the value of the parasitic capacitance sensed by the very sensitive analog front-end of the modulator. The presence of the water/liquid in the vicinity of the gel & the MEMS can be modeled as various parasitic capacitances/impairments—$C_{P1}$, $C_{P2}$, and $C_{P3}$ as shown in FIG. 6. The typical values of this parasitic capacitance is often comparable to the MEMS sense capacitance $C_S$ variation with pressure, resulting in large pressure shifts i.e. errors in pressure measurements. It should be mentioned that the term water or liquid is not limited to water alone. It could be salt water or other various liquids or residues. Water is used as the example due to the time-varying properties as it appears and then evaporates.

With reference to the capacitive block (642) of FIG. 6, the described impairment due to presence of water may be represented by a first, a second and a third parasitic capacitor ($C_{p1}$, $C_{p2}$, $C_{p3}$). According to embodiments of the present disclosure, the first parasitic capacitor ($C_{p1}$) may have substantially larger negative impact on the sensor performance compared to the negative impacts of the second and the third parasitic capacitors ($C_{p2}$, $C_{p3}$). The changing value of the parasitic capacitance ($C_{p1}$), corrupts the injected charge into the $C_{INT}$ and introduced large errors in the value of $C_S$ being measured, and thus affects the pressure measurements. On the other hand, the parasitic capacitance $C_{p2}$, is between the ASIC ground and the Chassis ground, and does not impact the signal charge from $C_S$ being integrated onto $C_{int}$. The parasitic capacitance ($C_{p3}$) is between the reference buffers and the ground. This capacitance gets charged and discharged every clock period, but is unable to affect the signal charge from $C_S$ being integrated onto $C_{int}$.

With reference to FIG. 6, and according to embodiments of the present disclosure, the first parasitic capacitor ($C_{p1}$) has a time varying capacitance representing a low frequency impairment compared to various timings based on which various circuits of the ADC (420) function.

With reference to FIGS. 5-6, and by way of example, and not of limitation, the sampling frequency associated with the sigma-delta modulator (500) of FIG. 5 or the first electronic circuit (600) of FIG. 6 may be at hundreds of KHz which is equivalent to a sampling period in the order of micro seconds. Continuing with the same example, the variation of the parasitic capacitor may be in the range of a few picofarads to 10 pF change per msec. This may be as large as the change in $C_S$ itself over its entire working range of pressure.

By virtue of having a sampling frequency which is substantially larger than the rate of change of the parasitic capacitor ($C_{p1}$) due to the water droplet, the auto-zeroing function as explained previously with respect to analog front-end (641) of FIG. 6 can combat and overcome the water droplet induced impairment in the same way as eliminating other low frequency noises/impairments such as the flicker noise or the OA offset. According to the teachings of the present disclosure, the generated parasitic capacitance due to the presence of the water droplet may be reduced by a factor which is of the order of few thousands.

Figure 9A:
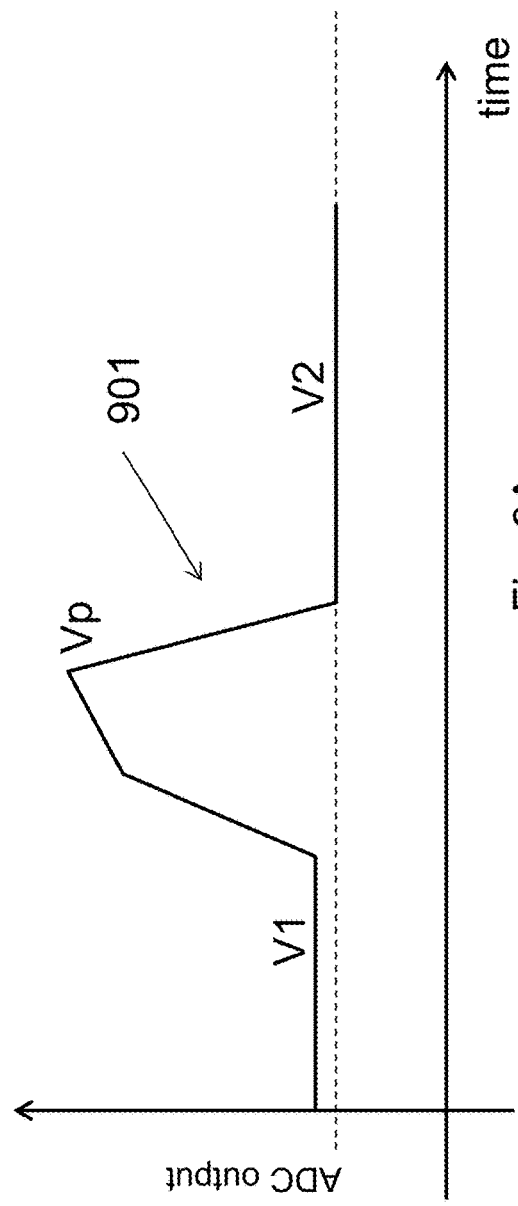
FIGS. 9A-9B—show graphs illustrating mitigation of the impacts of time varying parasitic capacitances on an electronic circuit, and in accordance with teachings of the present disclosure.
Figure 9B:
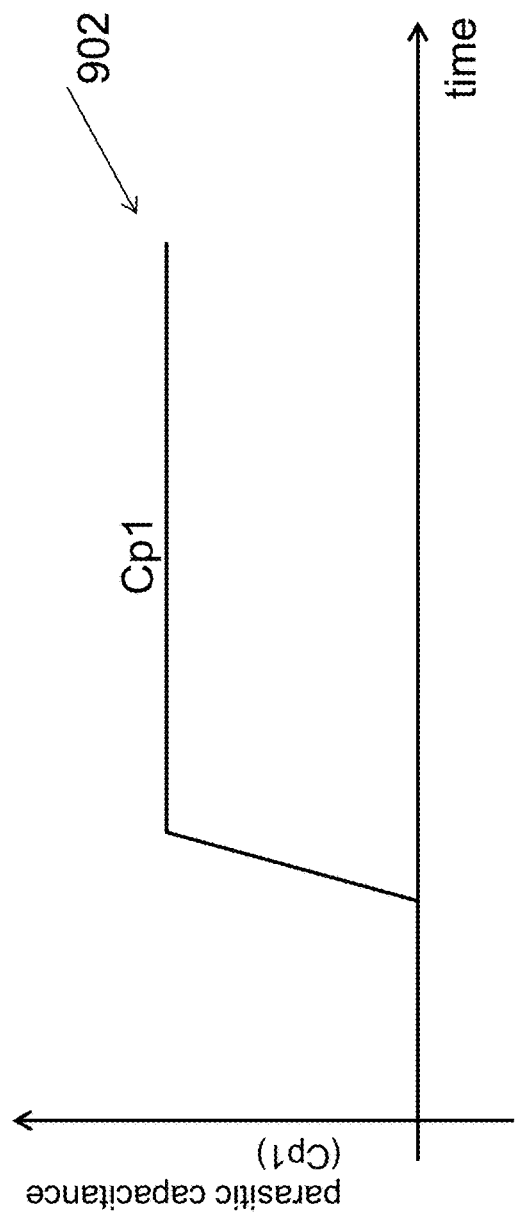

FIG. 9 shows graphs (901, 902) according to embodiments of the present disclosure. Graph (902) represents variations of the parasitic capacitor ($C_{p1}$) of FIG. 6 as a function of time. Graph (901) shows the variation of the system output (430) of the ADC (420) of FIG. 4, and as a function of time. As shown in FIG. 9, the sensor system output (430) being at a first voltage (V1), reacts to a sudden change in the parasitic capacitance going from zero to Cp1. The system output (430) increases first to a peak voltage (Vp) before dropping back to a second voltage (V2) which is substantially close to the first voltage (V1), the small difference being due to secondary effects. Here, V1, V2, and Vp are referenced as voltages, but they are simply the equivalent digital code at the ADC output (430) which directly relate to the capacitance of $C_S$ being measured, which is proportional to the pressure being sensed. With reference to FIGS. 4, 6, and 8A-8B, the person skilled in art will appreciate that when the system output (430) settles, the droplet is still present and sticking to the gel. In other words, charges are being removed constantly from the first input node (670) of the OA (660) by the water droplet. However, by virtue of implementing the auto-zeroing mechanism in accordance with the teachings of the present disclosure, the described charge removal is fought by injecting consistently charges to the input node (670) to maintain the voltage at this node equal to the voltage at the other input of the OA (660) which is ground. This is how the water droplet induced impairment related to parasitic capacitance is mitigated. Without this mitigation, the voltage would change from V1 to a value $VP_{NEW}$ that may be as large as 1000×-7000× larger, and it would stay at that level until the water droplet (or liquid) dissipates away. With reference to FIG. 9, in accordance with teachings of the present disclosure, presence or absence of droplet on a pressure sensor can be detected based on a comparison of the ADC output amplitude as shown by the graph (901) with a set desired amplitude threshold.

Figure 10:
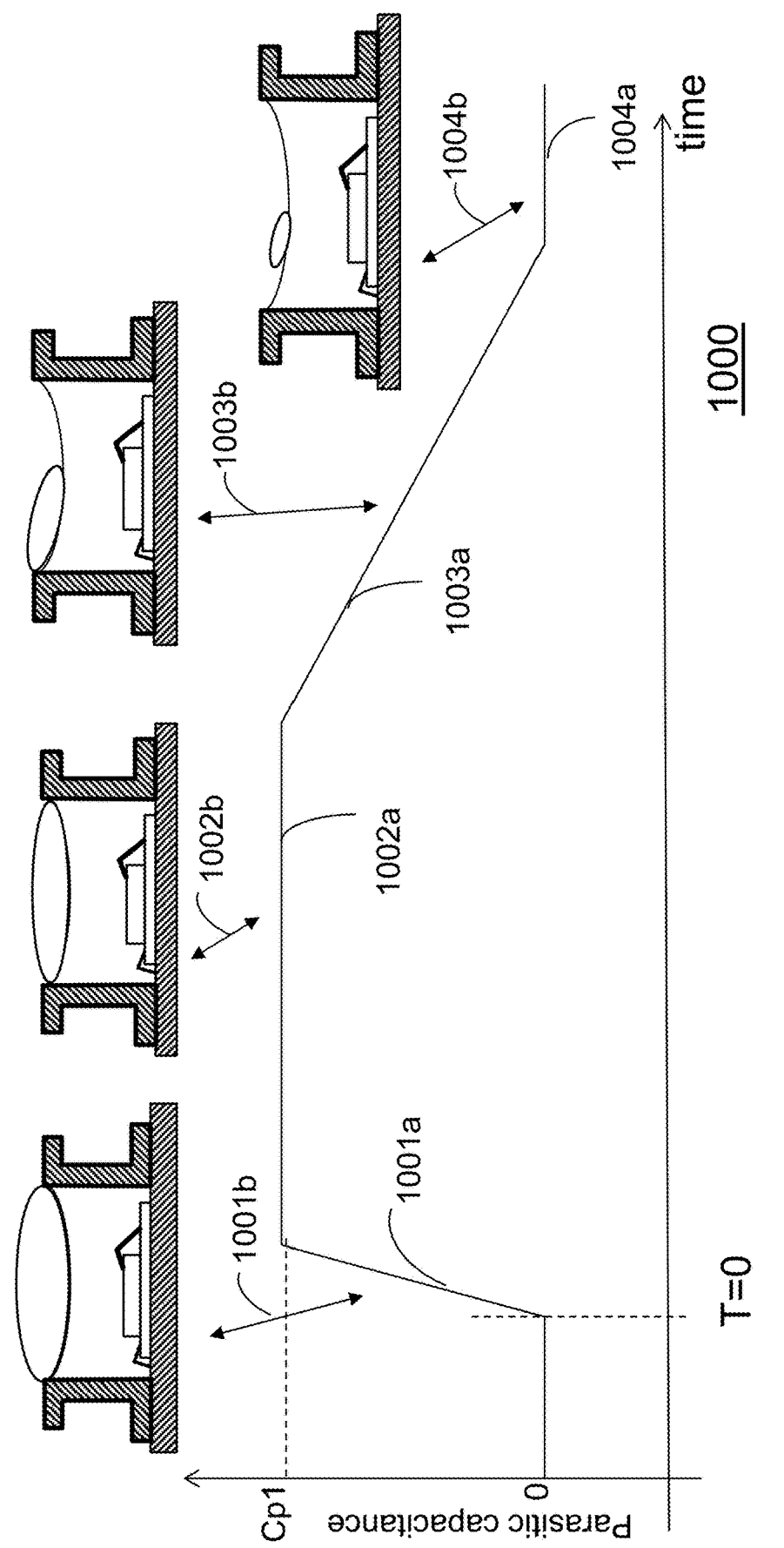
FIG. 10 shows various stages of the rapid onset of the water droplet and the slow dissipation of the droplet sitting on a pressure sensor.

With regards to the above-described water droplet issue, the dissipation of water droplet is a very slow phenomenon as represented by the diagram (1000) of FIG. 10, and in accordance with the teachings of the present disclosure. Referring back to FIG. 8A, diagram (1000) depicts a plot showing the variation of the capacitance of the parasitic capacitor ($C_{p1}$) as a function of time. Cross sections of pressure sensor (800) of FIG. 8B are shown from left to right illustrating different states of the water droplet (890) sitting on the water-proof gel (880) of FIG. 8B. Two sided arrows (1001b, 1002b, 1003b, 1004b) are used to show correspondence of each of the cross sections shown with respective graph sections (1001a, 1002a, 1003a, 1004a). From left to right, such graph sections represent the following situations: 1) at time instant T=0 water droplet sits on the pressure sensor gel, 2) water amount reduces, 3) contact of water droplet with the transparent gel reduces, and 4) water disappear or separate from the sensor body. As mentioned previously, and as can be seen from diagram (1000) of FIG. 10, complete dissipation of water takes place at a much slower rate, compared to the rate of increase of water droplet-induced parasitic capacitance to its maximum. Therefore, in view of what was described previously, the auto-zeroing mechanism mitigates all resulting parasitic capacitances during the life time of the corresponding water droplet.

Water droplet-induced parasitic capacitance in applications using pressure sensors is just an example used to describe some aspects of the teachings of the present disclosure. The person skilled in the art will understand that, without departing from the spirit and the scope of the invention, the teachings of the present disclosure are similarly applicable to sensors other than pressure sensors and to different time-varying impairments due to sources other than water droplets.

The term "MOSFET", as used in this disclosure, means any field effect transistor (FET) with an insulated gate and comprising a metal or metal-like, insulator, and semiconductor structure. The terms "metal" or "metal-like" include at least one electrically conductive material (such as aluminum, copper, or other metal, or highly doped polysilicon, graphene, or other electrical conductor), "insulator" includes at least one insulating material (such as silicon oxide or other dielectric material), and "semiconductor" includes at least one semiconductor material.

As should be readily apparent to one of ordinary skill in the art, various embodiments of the invention can be implemented to meet a wide variety of specifications. Unless otherwise noted above, selection of suitable component values is a matter of design choice and various embodiments of the invention may be implemented in any suitable IC technology (including but not limited to MOSFET structures), or in hybrid or discrete circuit forms. Integrated circuit embodiments may be fabricated using any suitable substrates and processes, including but not limited to standard bulk silicon, silicon-on-insulator (SOI), and silicon-on-sapphire (SOS). Unless otherwise noted above, the invention may be implemented in other transistor technologies such as bipolar, GaAs HBT, GaN HEMT, GaAs pHEMT, and MESFET technologies. However, the inventive concepts described above are particularly useful with an SOI-based fabrication process (including SOS), and with fabrication processes having similar characteristics. Fabrication in CMOS on SOI or SOS processes enables circuits with low power consumption, the ability to withstand high power signals during operation due to FET stacking, good linearity, and high frequency operation (i.e., radio frequencies up to and exceeding 50 GHz). Monolithic IC implementation is particularly useful since parasitic capacitances generally can be kept low (or at a minimum, kept uniform across all units, permitting them to be compensated) by careful design.

Voltage levels may be adjusted or voltage and/or logic signal polarities reversed depending on a particular specification and/or implementing technology (e.g., NMOS, PMOS, or CMOS, and enhancement mode or depletion mode transistor devices). Component voltage, current, and power handling capabilities may be adapted as needed, for example, by adjusting device sizes, serially "stacking" components (particularly FETs) to withstand greater voltages, and/or using multiple components in parallel to handle greater currents. Additional circuit components may be added to enhance the capabilities of the disclosed circuits and/or to provide additional functional without significantly altering the functionality of the disclosed circuits.

A number of embodiments of the invention have been described. It is to be understood that various modifications may be made without departing from the spirit and scope of the invention. For example, some of the steps described above may be order independent, and thus can be performed in an order different from that described. Further, some of the steps described above may be optional. Various activities described with respect to the methods identified above can be executed in repetitive, serial, or parallel fashion.

It is to be understood that the foregoing description is intended to illustrate and not to limit the scope of the invention, which is defined by the scope of the following claims, and that other embodiments are within the scope of the claims. (Note that the parenthetical labels for claim elements are for ease of referring to such elements, and do not in themselves indicate a particular required ordering or enumeration of elements; further, such labels may be reused in dependent claims as references to additional elements without being regarded as starting a conflicting labeling sequence).

The invention claimed is:

1. A sensor system comprising:
   a sensor comprising a sense capacitor with a variable sense capacitance;
   a readout integrated circuit comprising an analog to digital converter (ADC) having an ADC input connected to the sense capacitor, and
   an offset capacitor operatively charged and discharged out of phase with respect to the sense capacitor;
   wherein:
   a variable parasitic capacitance is able to be coupled to the ADC input; and
   when an input pressure is sensed by the sensor, the variable sense capacitance is modulated, thereby generating one or more ADC output signals in correspondence of the input pressure.

2. The sensor system of claim 1, wherein the sense capacitor is serially connected with the ADC input.

3. The sensor system of claim 1, wherein the ADC comprises a sigma-delta modulator.

4. The sensor system of claim 3, wherein the sigma-delta modulator is a multi-stage noise shaping (MASH) modulator comprising one or more integrators interconnected with one or more comparators.

5. The sensor system of claim 4, further comprising a decimation filter connected with the sigma-delta modulator.

6. The sensor system of claim 1, wherein the sensor further comprises a feedback capacitor, and wherein the offset capacitor is configured to center variations of the sense capacitor to a center of a full-scale of the ADC, the full-scale of the ADC being set by the feedback capacitor.

7. The sensor system of claim 1, wherein effects of the variable parasitic capacitance on the one or more ADC output signals are reduced using an auto-zeroing or chopping technique.

8. The sensor system of claim 6, further comprising an integrator including an operational amplifier and integration capacitor, an operational amplifier input being the ADC input.

9. The sensor system of claim 8, configured to receive a plurality of reference voltages and further comprising a switching arrangement being controlled by a plurality of clock signals to connect/disconnect the sense capacitor, the offset capacitor, and the feedback capacitor to/from corresponding reference voltages of the plurality of reference voltages.

10. The sensor system of claim 9, wherein the plurality of clock signals comprises clock signals that are generated based on the one or more ADC output signals.

11. The sensor system of claim 10, wherein:
in a charging phase:
    the switching arrangement is configured such that the plurality of reference voltages are sampled to store charges across the sense capacitor, the offset capacitor and the feedback capacitor; and
in an integration phase:
    a combination of the charges stored on the sense capacitor, the offset capacitor and the feedback capacitor during the charging phase is transferred to the integrating capacitor, thereby generating an integrator output signal in correspondence of the input pressure.

12. The sensor system of claim 11, wherein undesired charges due to the variable parasitic capacitance are sampled before the charging phase and are compensated for while generating the integrator output signal.

13. The sensor system of claim 11, wherein the plurality of clock signals have clock periods substantially smaller than a time during which the variable parasitic capacitance varies by one pF.

14. The sensor system of claim 11, wherein the plurality of clock signals have clocks rates in the range of hundreds of KHz and the variable parasitic capacitance varies within a range of tens of pf and having a rate of change within a range of tens of pF/msec.

15. The sensor system of claim 9, wherein the switching arrangement comprises metal-oxide semiconductor field-effect (MOSFET) transistors.

16. The sensor system of claim 1, wherein the sensor is a MEMS sensor.

17. The sensor system of claim 1, further comprising a gel material configured to transfer sensed pressure to the readout integrated circuit.

18. The sensor system of claim 17, wherein the sensor is connected to the readout integrated circuit via bondwires that are exposed to the gel material.

19. A method of measuring pressure comprising:
providing a sense capacitor with a variable sense capacitance;
providing an offset capacitor;
providing a readout circuit having an integrating capacitor, wherein a variable parasitic capacitance is able to be generated across a readout circuit input;
in a charging phase,
    storing first charges across the sense capacitor;
    storing second charges across the offset capacitor;
in an integration phase, transferring the first and the second charges to the integrating capacitor, thereby generating a readout circuit output signal in correspondence of an input pressure; and
configuring the offset capacitor to center variations of the sense capacitor to a center of a full-scale of the readout circuit,
wherein the storing the first and the second charges and the transferring the first and the second charges are performed such that a charging and discharging of the offset capacitor is out of phase with respect to the sense capacitor.

20. The method of claim 19, further comprising, before the charging phase, sampling the readout circuit input to capture undesired charges due to variable parasitic capacitance and compensate for the undesired charges during the integration phase.

21. The method of claim 20, further comprising:
providing a feedback capacitor configured to set the full-scale of the readout circuit;
in the charging phase, sampling the first and the second reference voltage during set time intervals to store third charges across the feedback capacitor; and
in the integration phase, transferring the third charges to the integration capacitor.

22. The method of claim 21, wherein the set time intervals are defined based on the readout circuit output signal.

23. The method of claim 22, wherein the readout circuit further comprises one or more integrators interconnected with one or more comparators.

24. A method of detecting presence of water droplets sitting on a pressure sensor using the method of claim 19, comprising comparing a measurement of the readout circuit output signal with a set threshold to detect presence or absence of water droplets.

* * * * *